United States Patent
Knoblauch

(10) Patent No.: US 10,152,619 B2
(45) Date of Patent: Dec. 11, 2018

(54) RFID RECEIVER AND METHOD OF EXTRACTING DATA BITS ENCODED IN A RADIO SIGNAL

(71) Applicant: LEGIC IDENTSYSTEMS AG, Wetzikon (CH)

(72) Inventor: Thomas Knoblauch, Jona (CH)

(73) Assignee: LEGIC IDENTSYSTEMS AG (CH)

( * ) Notice: Subject to any disclaimer, the term of this patent is extended or adjusted under 35 U.S.C. 154(b) by 0 days.

(21) Appl. No.: 15/615,973

(22) Filed: Jun. 7, 2017

(65) Prior Publication Data
US 2017/0372102 A1    Dec. 28, 2017

(30) Foreign Application Priority Data

Jun. 27, 2016  (CH) .......................................... 814/16

(51) Int. Cl.
| | |
|---|---|
| *H03D 1/00* | (2006.01) |
| *H04L 27/06* | (2006.01) |
| *G06K 7/10* | (2006.01) |
| *G06K 7/00* | (2006.01) |
| *H03M 13/37* | (2006.01) |
| *H04B 1/00* | (2006.01) |
| *H04B 1/10* | (2006.01) |
| *H04B 1/403* | (2015.01) |
| *H04B 5/00* | (2006.01) |
| *H04L 25/06* | (2006.01) |

(52) U.S. Cl.
CPC ....... *G06K 7/10336* (2013.01); *G06K 7/0008* (2013.01); *H03M 13/37* (2013.01); *H04B 1/005* (2013.01); *H04B 1/1018* (2013.01); *H04B 1/406* (2013.01); *H04B 5/0062* (2013.01); *H04L 25/061* (2013.01)

(58) Field of Classification Search
CPC ... G06K 7/1036; G06K 7/0008; H03M 13/37; H04B 1/005; H04B 1/1018; H04B 1/406; H04B 5/0062; H04L 25/061; H04L 25/03038
USPC ................................. 375/340, 350, 346, 316
See application file for complete search history.

(56) References Cited

U.S. PATENT DOCUMENTS

2010/0128773 A1* 5/2010 Fukuda ............. H04L 25/03038
375/232

* cited by examiner

*Primary Examiner* — Phuong Phu
(74) *Attorney, Agent, or Firm* — Ostrolenk Faber LLP

(57) ABSTRACT

An RFID receiver (1) comprises an antenna (11) configured to receive a radio signal (20) from an RFID transmitter (2) and to generate an electrical signal (110) from the radio signal (20) received from the RFID transmitter (2). A decoder circuit (10) is connected to the antenna (11) and configured to extract from the electrical signal (110) generated by the antenna (11) data bits encoded in the electrical signal (110). The decoder circuit (10) comprises an analog-to-digital converter (12) connected directly to the antenna (11) and configured to generate a digital input signal (13) from the electrical signal (110) generated by the antenna (11). A bit extractor (14) is connected to the analog-to-digital converter (12) and configured to extract the data bits from the digital input (13) signal generated by the analog-to-digital converter (12).

14 Claims, 4 Drawing Sheets

RFID RECEIVER AND METHOD OF EXTRACTING DATA BITS ENCODED IN A RADIO SIGNAL

FIELD OF THE INVENTION

The present invention relates to an RFID receiver and a method of extracting data bits encoded in a radio signal received from an RFID transmitter.

BACKGROUND OF THE INVENTION

The increased use and implementation of RFID transmitters and transponders (e.g. RFID devices in accordance with ISO 14443, ISO 15693, or proprietary implementations), in access control systems, payment systems, and other short and/or near field communication (NFC) applications, as well as logistics and radar applications, has led to a further increase of the deployment of RFID receivers and transceivers in mobile (communication) devices. Particularly, when RFID receivers and transceivers are implemented in portable mobile devices, such as mobile phones (smart phones) or body worn devices, e.g. wrist worn electronic smart watches, the electronic components required for implementing these RFID receivers and transceivers contribute significantly to the overall size and weight of these mobile devices. Moreover, contrary to the increasingly shorter life cycles of the firm and software modules of these mobile devices, which are flexibly and regularly updated with improved and additional features and functions, the RFID receivers and transceivers remain unchanged, because it is considered too labor intensive and costly, and thus impractical, to change hardware components in these mobile devices.

SUMMARY OF THE INVENTION

It is an object of this invention to provide an RFID receiver and a method of extracting data bits encoded in a radio signal received from an RFID transmitter, which RFID receiver and method do not have at least some of the disadvantages of the prior art.

According to the present invention, these objects are achieved through the features of the independent claims. In addition, further advantageous embodiments follow from the dependent claims and the description.

An RFID receiver comprises an antenna configured to receive a radio signal from an RFID transmitter, and to generate an electrical signal from the radio signal received from the RFID transmitter.

According to the present invention, the above-mentioned objects are particularly achieved in that the RFID receiver further comprises a decoder circuit connected to the antenna and configured to extract from the electrical signal, generated by the antenna, data bits encoded in the electrical signal. The decoder circuit comprises an analog-to-digital converter connected directly to the antenna and configured to generate a digital input signal from the electrical signal generated by the antenna. The decoder circuit further comprises a bit extractor connected to the analog-to-digital converter and configured to extract the data bits from the digital input signal generated by the analog-to-digital converter. Connecting the decoder circuit with its analog-to-digital converter directly to the antenna and extracting the data bits by the bit extractor of the decoder circuit from the digital input signal, generated by the analog-to-digital converter, has the advantage that no electronic components, such as diodes or transistors, need to be arranged and implemented external to the decoder circuit for signal processing, such as demodulation or other signal conditioning.

In an embodiment, the bit extractor comprises a pulse extractor configured to extract sub-bit pulses from the digital input signal generated by the analog-to-digital converter, and a bit detector configured to detect data bits in the sub-bit pulses.

In a further embodiment, the bit extractor comprises a low pass filter configured to extract sub-bit pulses from the digital input signal generated by the analog-to-digital converter.

In an embodiment, the low pass filter is implemented as a moving average filter.

In a further embodiment, the bit extractor comprises a high pass filter configured to remove a DC-component from the digital signal.

In an embodiment, the high pass filter is configured to remove the DC-component by subtracting a moving minimum value of the digital input signal from a moving maximum value of the digital signal.

In a further embodiment, the pulse extractor comprises a moving average filter configured to generate the sub-bit pulses from unfiltered sub-bit pulses of the digital signal.

In an embodiment, the pulse extractor further comprises a low pass filter arranged downstream of the pulse extractor's moving average filter.

In a further embodiment, the bit extractor comprises a sub-sampling module configured to sample the sub-bit pulses extracted by the pulse extractor at a reduced sampling rate that is lower than the sampling rate used by the analog-to-digital converter to generate the digital signal.

In an embodiment, the bit extractor is configured to generate a moving decision threshold for determining data bits from the sub-bit pulses.

In a further embodiment, the bit extractor is configured to determine varying sampling points using the moving decision threshold, and to sample the sub-bit pulses using the varying sampling points. Using sampling points that vary in time depending on the moving decision threshold has the advantage that the RFID receiver is more tolerant to fluctuations of carrier frequency (phase modulation) and/or amplitude (amplitude modulation) in the radio signal received from the RFID transmitter.

In an embodiment, the analog-to-digital converter comprises an electronic circuit, configured to generate the digital input signal from the electrical signal generated by the antenna, and the electronic circuit is connected to the antenna through a diode-free electrical connection.

In a further embodiment, the bit extractor comprises a processor and computer program code configured to direct the processor to extract the data bits from the digital input signal generated by the analog-to-digital converter. Implementing the bit extractor by way of computer program code makes it possible to flexibly update the bit extractor with new and/or improved features and/or functions.

In an embodiment, the antenna is configured to receive a radio signal from an RFID transmitter of an RFID transponder, and to generate an electrical signal from the radio signal received from the RFID transmitter of the RFID transponder.

In addition to the RFID receiver, the present invention also relates to a method of extracting data bits encoded in a radio signal received from an RFID transmitter. The method comprises: generating in an antenna of an RFID receiver an electrical signal from the radio signal received from the RFID transmitter; connecting directly to the antenna an analog-to-digital converter; generating in the analog-to-digital converter a digital input signal from the electrical signal generated by the antenna; connecting a bit extractor to the analog-to-digital converter; and extracting by the bit extractor the data bits from the digital input signal generated by the analog-to-digital converter.

BRIEF DESCRIPTION OF THE DRAWINGS

The present invention will be explained in more detail, by way of example, with reference to the drawings in which.

DETAILED DESCRIPTION OF THE PREFERRED EMBODIMENTS

Figure 1:
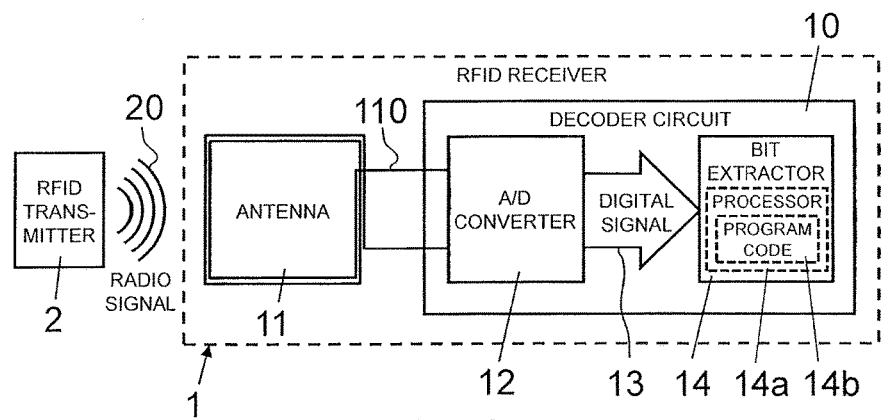
FIG. 1: shows a block diagram illustrating schematically an RFID receiver comprising an antenna, an analog-to-digital converter, and a bit extractor.

In FIG. 1, reference numeral 1 refers to a RFID receiver for receiving radio signals 20 from an RFID transmitter 2. Depending on the configuration, the radio transmitter 2 is part of an (active or passive) RFID transponder or an active RFID transceiver. For example, the radio transmitter 2 is configured in accordance with RFID standards such as ISO 14443 (ISO 14443A at 106 K bits/sec and ISO 14443B) and ISO 15693, or according to a proprietary RFID protocol. Accordingly, the radio signals 20 from the RFID transmitter 2 and received and processed by the RFID receiver 1 has a carrier frequency in the range of 100 KHz to 60+ GHz; particularly, the carrier frequency is set to the working frequency of an RFID system, e.g. 6.78 MHz, 13.56 as MHz, or 27.12 MHz (or another frequency).

As illustrated schematically in FIG. 1, the RFID receiver 1 comprises an antenna 11, e.g. a loop antenna, and a decoder circuit 10 connected electrically to the antenna 11.

The decoder circuit 10 comprises an analog-to-digital converter 12 that is connected directly to the receiver's antenna 11. In other words, there is a direct electrical connection between the circuitry of the analog-to-digital converter 12, which is configured to convert the analog input signal to the digital output signal, and the antenna 11, without any intermediary diodes, transistors, or the like, arranged between the antenna 11 and the analog-to-digital converter's circuitry for signal processing, such as demodulation or other signal conditioning. In short: there is a diode-free electrical connection between the receiver's antenna 11 and the analog-to-digital conversion circuitry 12, i.e. an electrical connection without any intermediary diodes, neither in series nor in parallel (GND). Responsive to a radio signal 20 received by the antenna 11 from the RFID transmitter 2, the antenna 11 generates a corresponding electrical signal 110. At its input, the analog-to-digital converter 12 receives the electrical signal 110 from the antenna 11 through the direct electrical connection and generates a corresponding digital input signal 13, available at the output of the analog-to-digital converter 12.

The decoder circuit 10 further comprises a bit extractor 14 connected to the output of the analog-to-digital converter 12 and configured to receive the digital input signal 13 from the analog-to-digital converter 12. The bit extractor 14 comprises an electronic circuit configured to extract data bits from the digital signal. At their origin at the RFID transmitter 2, the data bits were encoded in the transmitted radio signal 20, then left encoded in the corresponding electrical signal 110 generated by the antenna 11 and in the corresponding digital input signal generated by the analog-to-digital converter 12. Depending on the embodiment, the electronic circuit of the bit extractor 14 is a logic unit, such as an application-specific integrated circuits (ASICs) or field programmable gate array (FPGA) or uncommitted logic array (ULA), or, as illustrated in FIG. 1, a programmed processor 14a comprising program code 14b to direct the processor 14a to extract the data bits from the digital input signal 13 received from the analog-to-digital converter 12.

Figure 10:
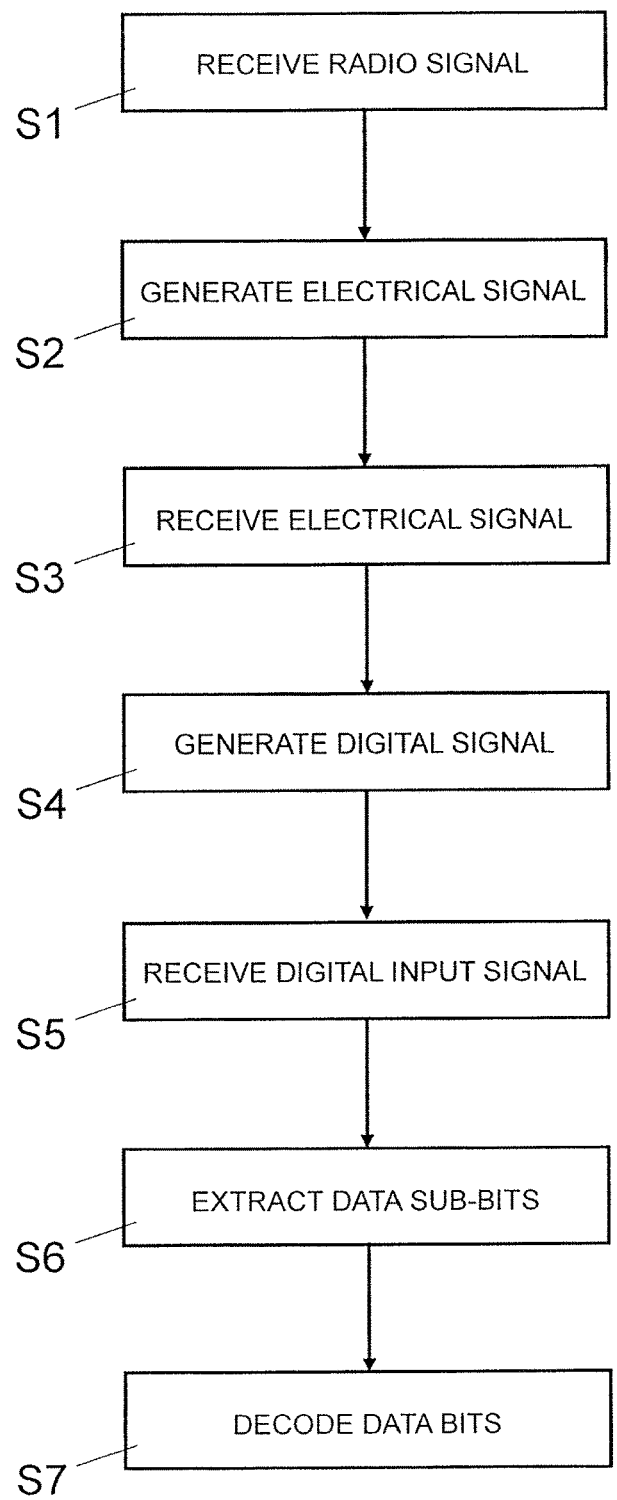
FIG. 10: shows a flow diagram illustrating a sequence of steps for extracting data bits encoded in a radio signal received from an RFID transmitter.

As illustrated in FIG. 10, in step S1, the radio signals 20 from the RFID transmitter 2 is received at the antenna 11 of the RFID receiver 1.

In step S2, the antenna 11 generates an electrical signal 110 responsive to the received radio signal 20.

In step S3, the electrical signal 110 is received at the input of the analog-to-digital converter 12.

In step S4, the analog-to-digital converter 12 generates from the received electrical signal 110 a digital signal 13.

In step S5, the digital signal 13 from the analog-to-digital converter 12 is received at the input of the bit extractor 14.

In step S6, the bit extractor 14 extracts data sub-bits 1000 encoded in the received radio signal 20 or the corresponding digital input signal 13 received from the analog-to-digital converter 12.

In step S7, the bit extractor 14 decodes the data bits from the extracted data sub-bits applying the appropriate decoding standard, e.g. Manchester Decoding.

Figure 2:
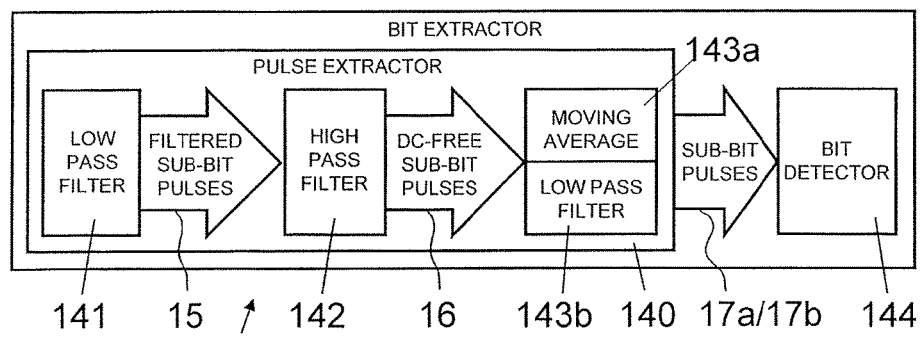
FIG. 2: shows a block diagram illustrating schematically a bit extractor comprising a pulse extractor and a bit detector.

As illustrated in FIG. 2, the bit extractor 14 comprises several functional modules and sub-modules. Specifically, the bit extractor 14 comprises a pulse extractor 140 and a bit detector 144. The pulse extractor 140 is configured to extract sub-bit pulses 17a/17b from the digital input signal 13 generated by the analog-to-digital converter 12. The bit detector 144 is configured to detect data bits in the sub-bit pulses 17a/17b.

In the embodiment of FIG. 2, the pulse extractor 140 comprises a low pass filter 141, a high pass filter 142, and a moving average filter/low pass filter block 143a/143b arranged downstream of the high pass filter 142.

Figure 3:
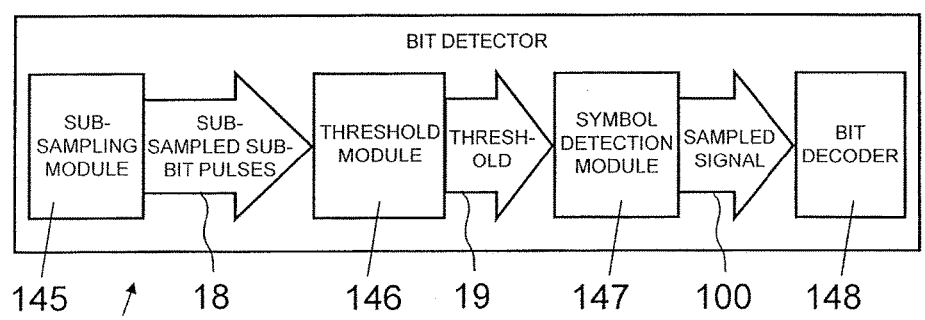
FIG. 3: shows a block diagram illustrating schematically a bit detector comprising a sub-sampling module, a threshold module, a symbol detection module, and a bit decoder.

As illustrated in FIG. 3, the bit detector 144 comprises a sub-sampling module 145, a threshold module 146, a symbol detection module 147, and a bit decoder 148.

As explained above in connection with bit extractor 14 as a whole, the functional modules and sub-modules of the bit extractor 14 are implemented correspondingly as logic units or as programmed software modules with program code 14b configured to control a processor 14a to implement and perform the functions of the respective module or sub-module.

Figure 4:
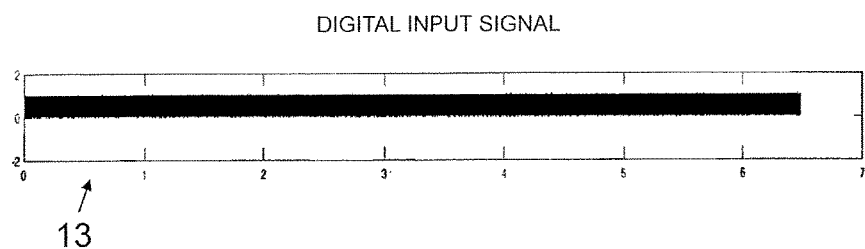
FIG. 4: shows a graph illustrating an example of a digital input signal generated from a received radio signal.

FIG. 4 illustrates an example of a digital input signal 13 generated by the analog-to-digital converter 12 from the electrical signal 110 corresponding to the radio signal 20 received at the antenna 11. Owing to the high carrier frequency in the range of 100 KHz to 60+ GHz, not much detail of the RFID transmitted load modulation is discernible in FIG. 4.

Figure 5:
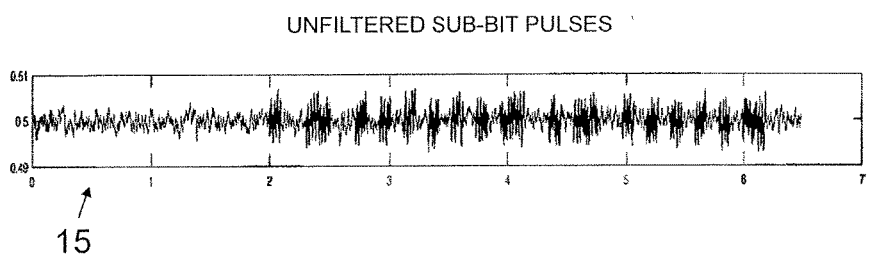
FIG. 5: shows a graph illustrating an example of unfiltered sub-bit pulses extracted from the digital input signal generated from the received radio signal.

FIG. 5 illustrates an example of unfiltered sub-bit pulses 15 extracted by the low pass filter 141 from the digital input signal 13, generated from the received radio signal 20 or the corresponding electrical signal 110 at the antenna 11. The low pass filter 141 is implemented as a moving average filter. In the context of ISO 14443, the moving average filter averages over the smallest (shortest) signal unit, e.g. in connection with ISO 14443, the moving average filter builds an average over a period of eight 13.56 MHZ oscillations (one skilled in the art will understand that other settings may be used to meet the requirements of respective other standards). The low pass filter 141 is implemented with a finite impulse response (FIR filter). Optionally, pulse extractor 14 includes an absolute module configured to perform an absolute function Abs( ) which is arranged downstream of the low pass filter 141 and reduces the unfiltered sub-bit pulses 15 to positive values only.

Figure 6:
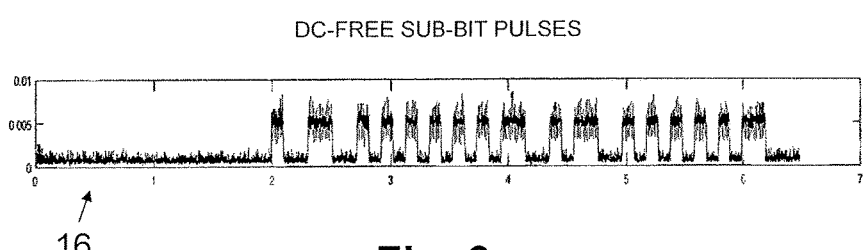
FIG. 6: shows a graph illustrating an example of DC-free sub-bit pulses filtered from unfiltered sub-bit pulses of the digital input signal.

FIG. 6 illustrates an example of DC-free sub-bit pulses 16 filtered by high pass filter 142 from the unfiltered sub-bit pulses 15 of the digital input signal 13. The high pass filter 142 is configured to remove the DC portion included in the digital input signal 13 or corresponding electrical signal 110, respectively. Specifically, the high pass filter 142 is configured to remove the DC component by subtracting the moving minimum value of the digital input signal 13 from the moving maximum value of the digital input signal 13. Removing the DC component has the advantage that a load snatch during transmission does not have a disturbing influence. The pulse extractor 140 further includes a trigger module (not illustrated) configured to mask or suppress signals that do not fit into the communication time slot of the RFID transmitter 2, e.g. in the context of ISO 14443, these time periods include Guard Time TR0, Synchronization Time TR1, and Frame Delay Time FDT. Suppressing these signal portions makes it possible to suppress disturbing transients and further conserves energy (the circuit is not clocked). The trigger module comprises a slope detector (high-pass filter with Schmitt-trigger). Preferably, the trigger module is arranged between the high pass filter 142 and the moving average filter/low pass filter block 143a/143b described below. Alternatively, the trigger module is arranged upstream of the high pass filter 142.

The moving average filter/low pass filter block 143a/143b is arranged downstream of the high pass filter 142 and comprises a moving average filter 143a and optionally a low pass filter 143b arranged downstream of said moving average filter 143a.

Figure 7:
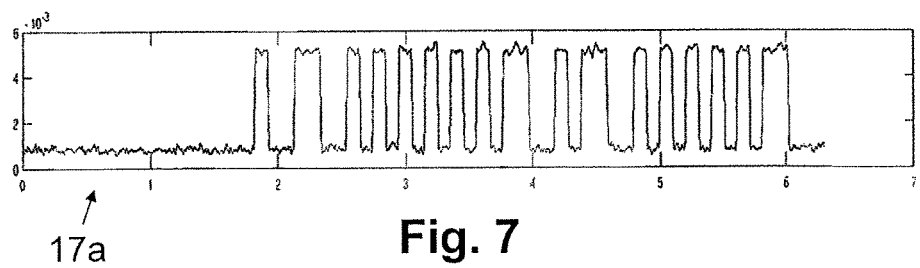
FIG. 7: shows a graph illustrating an example of sub-bit pulses extracted from DC-free sub-bit pulses of the digital input signal.
Figure 8:
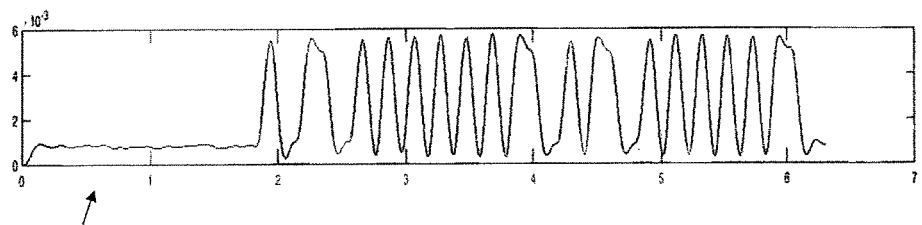
FIG. 8: shows a graph illustrating an example of low-pass filtered sub-bit pulses extracted from sub-bit pulses of the digital input signal.

FIG. 7 illustrates an example of sub-bit pulses 17a extracted by the moving average filter 143a from the DC-free sub-bit pulses 16 of the digital input signal 13 or corresponding electrical signal 110, respectively. FIG. 8 illustrates an example of low-pass filtered sub-bit as pulses 17b extracted from the DC-free sub-bit pulses 16. As can be seen in FIGS. 7 and 8, the signals with their long and short pulses are now distinguishably present. For example, in the context of ISO 14443, the low pass filter 143b is configured for processing 106 Kbits/sec signals (Fpass=50 KHz, Fstop=200 KHz, Astop=12 dB).

Figure 9:
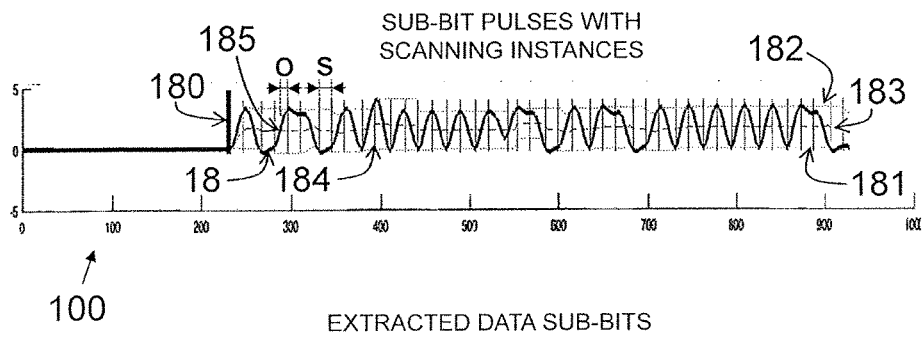
FIG. 9: shows a graph illustrating an example of varying sampling points applied to the sub-bit pulses extracted from the digital input signal, and data sub-bits extracted from the digital input signal.

In the embodiment of FIG. 3, the bit detector 144 comprises a sub-sampling module 145. The sub-sampling module 145 is configured to down sample the sub-bit pulses 17a/17a extracted by the bit extractor 140, e.g. by a factor ds=64. The eliminated sampling points do not contain relevant further information and are not necessary for the bit detector 144. Consequently, the functional modules of the bit detector 144 arranged downstream of the sub-sampling module 145 can be operated at a lower clock rate, making further energy conservation possible. The sub-sampled sub-bit pulses 18, illustrated in the upper graph of FIG. 9, are provided to threshold module 146.

The threshold module 146 is configured to determine a moving decision threshold. For that purpose, the threshold module 146 determines from the sub-sampled sub-bit pulses 18 moving minimum values 181, moving maximum values 182, and moving average values 183 calculated from the moving minimum and maximum values 181, 182. As illustrated in FIG. 9, the moving minimum and maximum values 181, 182 are held at their respective minimum or maximum absolute values for a defined holding time (max-hold). Thereby, fluctuations of signal values during a signal frame or symbol have no negative effect. The moving decision threshold is defined by the moving average values 183. The sub-sampled sub-bit pulses 18 and moving average values 183 or moving decision threshold, respectively, are provided to the symbol detection module 147.

The symbol detection module 147 is configured to detect the signalling symbols in the sub-sampled bit pulses 18, using the moving average values 183 or moving decision threshold, respectively. Specifically, the symbol detection module 147 determines the signalling symbols in the sub-sampled sub-bit pulses 18 depending on the points of intersection 185 of the sub-sampled sub-bit pulses 18 and the moving average values 183 or moving decision threshold, respectively. In the embodiment illustrated in FIG. 9, the signalling symbols are detected by determining sampling instances (time of sampling points) 184 depending on said points of intersection 185. In FIG. 9, the sampling instances 184 are illustrated by (thin) vertical lines. The first (bold) vertical line from the left illustrates the start of frame 180. The start of frame 180 is determined by the symbol detection module 147 by checking whether the sub-sampled sub-bit pulses 18 exceed a start of frame threshold value. The first sampling instance 184 is set at one defined (standardized) symbol duration s after the start of frame 180. Subsequently, the sampling instances 184 are set by the symbol detection module 147 at a defined sampling offset o after the intersection points 185, whereby the sampling offset o is half of the symbol duration s; unless, there is no intersection point 185 within a period of a symbol duration s, in which case the sampling instance 184 is set at one symbol duration s, after the preceding sampling instance 184. In this way, as can be seen in the example of FIG. 9, the timing of the sampling instances 184 varies over time making the RFID receiver 1 more tolerant to fluctuations of carrier frequency (phase modulation) and/or amplitude (amplitude modulation) in the radio signal 20 received from the RFID transmitter 2. Furthermore, the RFID receiver 1 becomes more tolerant to a reduction of the radio signal 20, e.g. caused by the presence of another RFID transmitter or transponder, and to low pass affected edges of the radio signal 20 received from the RFID transmitter 2. The sampled signal 100 is provided to the bit decoder 148.

The bit decoder 148 is configured to decode the data bits from the sampled signal 100. In the lower part of FIG. 9, the sub-data bits 1000 extracted from the sampled signal 100 are shown. The detection of the data bits from the data sub-bits 1000 is performed using Manchester Decoding. In an alternative embodiment, the symbols and data sub-bits are determined by analysing the slopes of the sub-sampled sub-bit pulses 18 with regards to their timing and their respective increase or decrease.

It should be noted that, in the description, the computer program code has been associated with specific functional modules and the sequence of the steps has been presented in a specific order, one skilled in the art will understand, however, that the computer program code may be structured differently and that the order of at least some of the steps could be altered, without deviating from the scope of the invention.

The invention claimed is:

1. An RFID receiver, comprising:
an antenna configured to receive a radio signal from an RFID transmitter, and to generate an electrical signal from the radio signal received from the RFID transmitter; and
a decoder circuit connected to the antenna and configured to extract from the electrical signal generated by the antenna data bits encoded in the electrical signal; wherein the decoder circuit comprises:
an analog-to-digital converter connected directly to the antenna and configured to generate a digital input signal from the electrical signal generated by the antenna, and
a bit extractor connected to the analog-to-digital converter and configured to extract the data bits from the digital input signal generated by the analog-to-digital converter,
wherein the bit extractor comprises a pulse extractor configured to extract sub-bit pulses from the digital input signal generated by the analog-to-digital converter, and a bit detector configured to detect data bits in the sub-bit pulses, the bit extractor comprising a sub-sampling module configured to sample the sub-bit pulses extracted by the pulse extractor at a reduced sampling rate which is lower than the sampling rate used by the analog-to-digital converter to generate the digital signal.

2. The RFID receiver of claim 1, wherein the bit extractor comprises a low pass filter configured to extract sub-bit pulses from the digital input signal generated by the analog-to-digital converter.

3. The RFID receiver of claim 2, wherein the low pass filter is implemented as a moving average filter.

4. The RFID receiver of claim 1, wherein the pulse extractor comprises a moving average filter configured to generate the sub-bit pulses from unfiltered sub-bit pulses of the digital signal.

5. The RFID receiver of claim 4, wherein the pulse extractor further comprises a low pass filter arranged downstream of the pulse extractor's moving average filter.

6. The RFID receiver of claim 1, wherein the bit extractor is configured to generate a moving decision threshold for determining data bits from the sub-bit pulses.

7. The RFID receiver of claim 1, wherein the analog-to-digital converter comprises an electronic circuit configured to generate the digital input signal from the electrical signal generated by the antenna; and the electronic circuit is connected to the antenna through a diode-free electrical connection.

8. The RFID receiver of claim 1, wherein the bit extractor comprises a processor and computer program code configured to direct the processor to extract the data bits from the digital input signal generated by the analog-to-digital converter.

9. The RFID receiver of claim 1, wherein the antenna is configured to receive a radio signal from an RFID transmitter of an RFID transponder, and to generate an electrical signal from the radio signal received from the RFID transmitter of the RFID transponder.

10. A method of extracting data bits encoded in a radio signal received from an RFID transmitter, the method comprising:
generating in an antenna of an RFID receiver an electrical signal from the radio signal received from the RFID transmitter;
connecting directly to the antenna an analog-to-digital converter;
generating in the analog-to-digital converter a digital input signal from the electrical signal generated by the antenna;
connecting a bit extractor to the analog-to-digital converter; and
extracting by the bit extractor the data bits from the digital input signal generated by the analog-to-digital converter;
wherein extracting by the bit extractor the data bits from the digital input signal comprises:
extracting by a pulse extractor sub-bit pulses from the digital input signal;
detecting by a bit detector data bits in the sub-bit pulses; and
sampling by a sub-sampling module the sub-bit pulses extracted by the pulse extractor at a reduced sampling rate which is lower than the sampling rate used by the analog-to-digital converter to generate the digital signal.

11. An RFID receiver, comprising:
an antenna configured to receive a radio signal from an RFID transmitter, and to generate an electrical signal from the radio signal received from the RFID transmitter; and
a decoder circuit connected to the antenna and configured to extract from the electrical signal generated by the antenna data bits encoded in the electrical signal; wherein the decoder circuit comprises:
an analog-to-digital converter connected directly to the antenna and configured to generate a digital input signal from the electrical signal generated by the antenna, and
a bit extractor connected to the analog-to-digital converter and configured to extract the data bits from the digital input signal generated by the analog-to-digital converter,
wherein the bit extractor comprises a high pass filter configured to remove a DC-component from the digital signal by subtracting a moving minimum value of the digital input signal from a moving maximum value of the digital signal.

12. An RFID receiver, comprising:
an antenna configured to receive a radio signal from an RFID transmitter, and to generate an electrical signal from the radio signal received from the RFID transmitter; and a decoder circuit connected to the antenna and configured to extract from the electrical signal generated by the antenna data bits encoded in the electrical signal; wherein the decoder circuit comprises:

an analog-to-digital converter connected directly to the antenna and configured to generate a digital input signal from the electrical signal generated by the antenna, and a bit extractor connected to the analog-to-digital converter and configured to extract the data bits from the digital input signal generated by the analog-to-digital converter, wherein the bit extractor is configured to determine varying sampling points using the moving decision threshold, and to sample the sub-bit pulses using the varying sampling points.

13. A method of extracting data bits encoded in a radio signal received from an RFID transmitter, the method comprising:

generating in an antenna of an RFID receiver an electrical signal from the radio signal received from the RFID transmitter;

connecting directly to the antenna an analog-to-digital converter;

generating in the analog-to-digital converter a digital input signal from the electrical signal generated by the antenna;

connecting a bit extractor to the analog-to-digital converter; and extracting by the bit extractor the data bits from the digital input signal generated by the analog-to-digital converter;

wherein extracting by the bit extractor the data bits from the digital input signal comprises removing with a high pass filter of the bit extractor a DC-component from the digital signal by subtracting a moving minimum value of the digital input signal from a moving maximum value of the digital signal.

14. A method of extracting data bits encoded in a radio signal received from an RFID transmitter, the method comprising:

generating in an antenna of an RFID receiver an electrical signal from the radio signal received from the RFID transmitter;

connecting directly to the antenna an analog-to-digital converter;

generating in the analog-to-digital converter a digital input signal from the electrical signal generated by the antenna;

connecting a bit extractor to the analog-to-digital converter; and extracting by the bit extractor the data bits from the digital input signal generated by the analog-to-digital converter;

wherein extracting by the bit extractor the data bits from the digital input signal comprises determining by the bit extractor varying sampling points using the moving decision threshold, and sampling the sub-bit pulses using the varying sampling points.

\* \* \* \* \*